(12) United States Patent
Masuda et al.

(10) Patent No.: US 8,686,435 B2
(45) Date of Patent: Apr. 1, 2014

(54) SILICON CARBIDE SEMICONDUCTOR DEVICE

(75) Inventors: Takeyoshi Masuda, Osaka (JP); Toru Hiyoshi, Osaka (JP); Keiji Wada, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 47 days.

(21) Appl. No.: 13/434,233

(22) Filed: Mar. 29, 2012

(65) Prior Publication Data

US 2012/0248461 A1 Oct. 4, 2012

Related U.S. Application Data

(60) Provisional application No. 61/470,612, filed on Apr. 1, 2011.

(30) Foreign Application Priority Data

Apr. 1, 2011 (JP) .................................. 2011-081488

(51) Int. Cl.
*H01L 21/336* (2006.01)
*H01L 29/04* (2006.01)
*H01L 29/12* (2006.01)
*H01L 29/78* (2006.01)

(52) U.S. Cl.
USPC ............. 257/77; 257/622; 257/628; 438/268; 438/270

(58) Field of Classification Search
CPC ....... H01L 21/336; H01L 29/04; H01L 29/12; H01L 29/78
USPC .......................................................... 257/77
See application file for complete search history.

(56) References Cited

U.S. PATENT DOCUMENTS 5,744,826 A * 4/1998 Takeuchi et al. ................. 257/77
6,133,587 A * 10/2000 Takeuchi et al. ................. 257/77

(Continued)

FOREIGN PATENT DOCUMENTS

JP 2001-144288 A * 5/2001 ............. H01L 29/12
JP 2002-261275 A 9/2002

(Continued)

OTHER PUBLICATIONS

H. Yano et al ; "High Inversion Channel Mobility in 4H-SiC Planar MOSFETs" FED Journal vol. 11 No. 2; (2000); pp. 81-84.*

(Continued)

*Primary Examiner* — Kevin Parendo
*Assistant Examiner* — Charles N Ausar-El
(74) *Attorney, Agent, or Firm* — Venable LLP; Michael A. Sartori; Tamatane J. Aga

(57) ABSTRACT

A silicon carbide layer is epitaxially formed on a main surface of a substrate. The silicon carbide layer is provided with a trench having a side wall inclined relative to the main surface. The side wall has an off angle of not less than 50° and not more than 65° relative to a {0001} plane. A gate insulating film is provided on the side wall of the silicon carbide layer. The silicon carbide layer includes: a body region having a first conductivity type and facing a gate electrode with the gate insulating film being interposed therebetween; and a pair of regions separated from each other by the body region and having a second conductivity type. The body region has an impurity density of $5 \times 10^{16}$ cm$^{-3}$ or greater. This allows for an increased degree of freedom in setting a threshold voltage while suppressing decrease of channel mobility.

24 Claims, 3 Drawing Sheets

(56) References Cited

U.S. PATENT DOCUMENTS

| | | | |
|---|---|---|---|
| 6,281,521 B1 * | 8/2001 | Singh | 257/77 |
| 7,400,017 B2 * | 7/2008 | Aono et al. | 257/370 |
| 7,691,711 B2 * | 4/2010 | Stum et al. | 438/268 |
| 8,022,414 B2 * | 9/2011 | Suzuki et al. | 257/77 |
| 8,043,949 B2 * | 10/2011 | Fujikawa | 438/589 |
| 8,097,501 B2 * | 1/2012 | Sakuma et al. | 438/198 |
| 8,120,075 B1 * | 2/2012 | Luo et al. | 257/288 |
| 2005/0258493 A1 | 11/2005 | Aono et al. | |
| 2008/0230787 A1 | 9/2008 | Suzuki et al. | |
| 2010/0062582 A1 | 3/2010 | Fujikawa | |
| 2011/0133211 A1 * | 6/2011 | Malhan et al. | 257/77 |
| 2011/0180813 A1 * | 7/2011 | Harada et al. | 257/77 |
| 2011/0254010 A1 * | 10/2011 | Zhang | 257/66 |

FOREIGN PATENT DOCUMENTS

| | | | | |
|---|---|---|---|---|
| JP | 2005-056868 | | 3/2005 | |
| JP | 2005-136386 A | * | 5/2005 | H01L 21/318 |
| JP | 2005-317751 | | 11/2005 | |
| JP | 2005-340685 A | * | 12/2005 | H01L 21/336 |
| JP | 2006-156478 A | * | 6/2006 | H01L 21/336 |
| JP | 2006-228901 | | 8/2006 | |
| JP | 2008-235546 | | 10/2008 | |
| JP | 2010-040564 | | 2/2010 | |
| WO | WO-2008/065782 A1 | | 6/2008 | |
| WO | WO-2010/116886 A1 | | 10/2010 | |

OTHER PUBLICATIONS

Agarwal et al, "Temperature Dependence of Fowler-Nordheim Current in 6H- and 4H-SiC MOS Capacitors"; IEEE Electron Device Letters, vol. 18, No. 12, Dec. 1997, pp. 592-594.*

Koketsu et al., "Control of Inclined Sidewall Angles of 4H-SiC Mesa and Trench Structures", 2011 Materials Science Forum, 679-680, 485.*

Ryu et al., "Critical Issues for MOS Based Power Devices in 4H-SiC," Materials Science Forum, vols. 615-617, pp. 743-748 (2009).

Kono et al., "1.2 kV Vertical Power SiC MOSFET with Stable High-Temperature Characteristics," Toshiba Review, vol. 65, No. 1, pp. 23-26 (2010).

* cited by examiner

SILICON CARBIDE SEMICONDUCTOR DEVICE

BACKGROUND OF THE INVENTION

1. Field of the Invention

The present invention relates to a silicon carbide semiconductor device, more particularly, a silicon carbide semiconductor device having a gate electrode.

2. Description of the Background Art

In recent years, in order to achieve high breakdown voltage, low loss, and utilization of semiconductor devices under a high temperature environment, silicon carbide has begun to be adopted as a material for a semiconductor device. Silicon carbide is a wide band gap semiconductor having a band gap larger than that of silicon, which has been conventionally widely used as a material for semiconductor devices. Hence, by adopting silicon carbide as a material for a semiconductor device, the semiconductor device can have a high breakdown voltage, reduced on-resistance, and the like. Further, the semiconductor device thus adopting silicon carbide as its material has characteristics less deteriorated even under a high temperature environment than those of a semiconductor device adopting silicon as its material, advantageously.

Of such semiconductor devices employing silicon carbide as their material, there are semiconductor devices which controls appearance and disappearance of an inversion layer in a channel region in accordance with a predetermined threshold voltage so as to conduct or interrupt a current. Examples of such semiconductor devices include a MOSFET (Metal Oxide Semiconductor Field Effect Transistor) and an IGBT (Insulated Gate Bipolar Transistor). For such semiconductor devices, various studies have been conducted to adjust the threshold voltage or improve channel mobility (for example, see Sei-Hyung Ryu et al., "Critical Issues for MOS Based Power Devices in 4H—SiC", Materials Science Forum (2009), pp. 743-748).

Here, for example, in a MOSFET with an n channel, a p type body region having p type conductivity is formed. In this p type body region, a channel region is formed. By increasing the density (doping density) of a p type impurity (for example, B (boron), Al (aluminum), or the like) in the p type body region, the threshold voltage is positively shifted in value to allow the MOSFET to become substantially a normally-off type or become the normally-off type. On the other hand, a MOSFET with a p channel is contrary to the case of the n channel. Namely, by increasing the density of an n type impurity in an n type body region, the threshold voltage is negatively shifted in value to allow the MOSFET to become substantially the normally-off type or become the normally-off type.

However, when adjusting the threshold voltage in this way, channel mobility is significantly decreased, disadvantageously. This is because the dopant with such an increased doping density causes noticeable scattering of electrons. In view of this, for example, the doping density of the p type body region is set at, for example, approximately $1 \times 10^{16}$ $cm^{-3}$ to approximately $4 \times 10^{16}$ $cm^{-3}$. This makes it difficult to freely set the threshold voltage while securing sufficient channel mobility in a conventional semiconductor device. In particular, it is difficult to allow the conventional semiconductor device to become substantially the normally-off type or become the normally-off type, disadvantageously.

SUMMARY OF THE INVENTION

The present invention has been made to solve the foregoing problem, and has its object to provide a silicon carbide semiconductor device allowing for an increased degree of freedom in setting a threshold voltage while suppressing decrease of channel mobility.

A silicon carbide semiconductor device of the present invention has a substrate, a silicon carbide layer, a gate insulating film, and a gate electrode. The substrate is made of silicon carbide having a hexagonal crystal structure and has a main surface. The silicon carbide layer is epitaxially formed on the main surface of the substrate. The silicon carbide layer is provided with a trench having a side wall inclined relative to the main surface. The side wall has an off angle of not less than 50° and not more than 65° relative to a {0001} plane. The gate insulating film is provided on the side wall of the silicon carbide layer. The gate electrode is provided on the gate insulating film. The silicon carbide layer includes a body region having a first conductivity type and facing the gate electrode with the gate insulating film being interposed therebetween, and a pair of regions separated from each other by the body region and having a second conductivity type. The body region has an impurity density of $5 \times 10^{16}$ $cm^{-3}$ or greater.

According to this semiconductor device, channel controlled by the gate electrode is formed on the side wall within the body region. The present inventors have found that with this side wall having an off angle of not less than 50° and not more than 65° relative to the {0001} plane, the channel mobility can be suppressed from being decreased, even when the body region, in which the channel is to be formed, has a high impurity density of $5 \times 10^{16}$ $cm^{-3}$ or greater. Hence, according to this semiconductor device, the threshold voltage can be greatly shifted by employing the high impurity density, while suppressing decrease of the channel mobility.

It should be noted that the term "impurity" refers to an impurity which generates majority carriers when being introduced into silicon carbide.

In the semiconductor device, the side wall may have an off orientation forming an angle of 5° or smaller relative to a <01-10> direction. In this way, the off orientation substantially corresponds to the <01-10> direction, with the result that the plane orientation of the side wall becomes close to the {03-38} plane. In this case, the present inventors have found that the above-described function and effect are particularly securely obtained.

In the semiconductor device, the side wall may have an off angle of not less than −3° and not more than 5° relative to a {03-38} plane relative to the <01-10> direction.

Accordingly, the channel mobility can be further improved. Here, setting the off angle at not less than −3° and not more than +5° relative to the plane orientation of {03-38} is based on a fact that particularly high channel mobility was obtained in this set range as a result of inspecting a relation between the channel mobility and the off angle.

Further, the "off angle relative to the {03-38} plane in the <01-10> direction" refers to an angle formed by an orthogonal projection of a normal line of the above-described side wall to a flat plane including the <01-10> direction and the <0001> direction, and a normal line of the {03-38} plane. The sign of positive value corresponds to a case where the orthogonal projection approaches in parallel with the <01-10> direction whereas the sign of negative value corresponds to a case where the orthogonal projection approaches in parallel with the <0001> direction.

It should be noted that the side wall more preferably has a plane orientation of substantially {03-38}. Here, the expression "the side wall has a plane orientation of substantially {03-38}" is intended to encompass a case where the plane orientation of the side wall is included in a range of off angle such that the plane orientation can be substantially regarded as {03-38} in consideration of processing accuracy of the side wall. In this case, the range of off angle is, for example, a range of off angle of ±2° relative to {03-38}. Accordingly, the above-described channel mobility can be further improved.

In the semiconductor device, the side wall may correspond to a plane of a carbon plane side of the silicon carbide constituting the substrate.

In this way, the channel mobility can be further improved. Here, the (0001) plane of single-crystal silicon carbide of hexagonal crystal is defined as the silicon plane whereas the (000-1) plane is defined as the carbon plane. In other words, when employing the configuration in which the off orientation of the side wall forms an angle of 5° or smaller relative to the <01-10> direction, the channel mobility is further improved by adapting the main surface to correspond to a plane close to the (0-33-8) plane.

In the semiconductor device, the body region may have an impurity density of $1\times10^{20}$ cm$^{-3}$ or smaller.

Even when the impurity density of the body region is set at $1\times10^{20}$ cm$^{-3}$ or smaller, the threshold voltage can be set with a sufficient degree of freedom. Meanwhile, if a doping density exceeding $1\times10^{20}$ cm$^{-3}$ is adopted, crystallinity may be deteriorated, disadvantageously.

The semiconductor device may be a normally-off type. According to the semiconductor device of the present invention, even when the doping density of the body region is increased to such an extent that the semiconductor device serves as the normally-off type, the decrease of the channel mobility can be sufficiently suppressed.

In the semiconductor device, the gate electrode may be made of polysilicon having the first conductivity type. Namely, when the first conductivity type is p type, the gate electrode can be made of p type polysilicon and when the first conductivity is n type, the gate electrode can be made of n type polysilicon. The term "p type polysilicon" refers to polysilicon in which majority carriers are positive holes, whereas the term "n type polysilicon" refers to polysilicon in which majority carriers are electrons. In this way, the semiconductor device can readily become the normally-off type.

In the semiconductor device, the gate electrode may be made of n type polysilicon. In this way, switching speed of the semiconductor device can be improved.

In the semiconductor device, the gate insulating film may have a thickness of not less than 25 nm and not more than 70 nm. When the gate insulating film has a thickness smaller than 25 nm, dielectric breakdown may take place during operation. On the other hand, when the thickness of the gate insulating film exceeds 70 nm, the absolute value of the gate voltage needs to be increased. In view of this, the thickness of the gate insulating film is set at not less than 25 nm and not more than 70 nm, thereby readily solving the above-described problem.

In the semiconductor device, the first conductivity type may be p type and the second conductivity type may be n type. Namely, the semiconductor device may be of n channel type. In this way, there can be provided a semiconductor device in which electrons, for which high mobility can be readily secured, are majority carriers.

In the semiconductor device, the body region may have an impurity density of not less than $8\times10^{16}$ cm$^{-3}$ and not more than $3\times10^{18}$ cm$^{-3}$. In this way, there can be obtained a threshold voltage of approximately 0 V to approximately 5 V at a normal operation temperature. This facilitates replacing, with the semiconductor device of the present application, a semiconductor device employing silicon as its material, and also allows the semiconductor device to stably become the normally-off type. Further, the channel mobility can be avoided from being decreased due to a high impurity density.

In the semiconductor device, the gate electrode may have a threshold voltage which allows a weak inversion layer to be formed in the body region, the threshold voltage being 2 V or greater in a temperature range of not less than a room temperature and not more than 100° C. In this way, under normal operation temperature, the normally-off state can be maintained more securely. Here, specifically, the room temperature is 27° C.

In the semiconductor device, the threshold voltage may be 3 V or greater at 100° C. In this way, even when the operation temperature is high, the normally-off state can be maintained more securely.

In the semiconductor device, the threshold voltage may be 1 V or greater at 200° C. In this way, even when the operation temperature is high, the normally-off state can be maintained more securely.

In the semiconductor device, the threshold voltage may have a temperature dependency of −10 mV/° C. or greater. This leads to suppression of a tendency of the threshold voltage decreasing to come close to zero due to temperature increase, as compared with a case where the temperature dependency is smaller than −10 mV/° C. (i.e., a case where the temperature dependency has its absolute value greater than 10 mV/° C. and has a negative sign). In this way, the normally-off state can be maintained stably.

In the semiconductor device, channel mobility of electrons may be 30 cm$^2$/Vs or greater at a room temperature. In this way, the on-resistance of the semiconductor device can be sufficiently suppressed readily.

In the semiconductor device, the channel mobility of electrons may be 50 cm$^2$/Vs or greater at 100° C. In this way, even when the operation temperature is high, the on-resistance of the semiconductor device can be sufficiently suppressed.

In the semiconductor device, the channel mobility of electrons may be 40 cm$^2$/Vs or greater at 150° C. In this way, even when the operation temperature is higher, the on-resistance of the semiconductor device can be sufficiently suppressed.

In the semiconductor device, the channel mobility of electrons may have a temperature dependency of −0.3 cm$^2$/Vs° C. or greater. In this way, the on-resistance of the semiconductor device can be stably suppressed.

In the semiconductor device, a barrier height at an interface between the silicon carbide layer and the gate insulating film may be not less than 2.2 eV and not more than 2.6 eV.

With the barrier height being large, leakage current (tunnel current) flowing in the gate insulating film can be suppressed. However, channel mobility may be decreased if simply employing, for the contact surface of the silicon carbide layer with the gate insulating film, a crystal plane allowing for a large barrier height between the gate insulating film and the silicon carbide layer. To address this, the crystal plane allowing for a barrier height of not less than 2.2 eV and not more than 2.6 eV is employed for the contact surface thereof with the gate insulating film, thereby securing high channel mobility while suppressing the leakage current. Such a barrier height can be readily attained by employing a side wall having an off angle of not less than 50° and not more than 65° relative to the {0001} plane. It should be noted that the term "barrier height" refers to a size of a band gap between the conduction band of the silicon carbide layer and the conduction band of the gate insulating film.

The semiconductor device may further include a breakdown voltage holding layer separating the body region and the substrate from each other. Preferably, in an ON state, a channel resistance, which is a resistance value of a channel region formed in the body region, is smaller than a drift resistance, which is a resistance value in the breakdown voltage holding layer. Accordingly, on-resistance of the semiconductor device can be reduced. Such a relation between the channel resistance and the drift resistance can be readily achieved by employing a side wall having an off angle of not less than 50° and not more than 65° relative to the {0001} plane.

The semiconductor device may be a vertical type insulated gate field effect transistor.

As apparent from the description above, according to the semiconductor device of the present invention, there can be provided a silicon carbide semiconductor device allowing for an increased degree of freedom in setting the threshold voltage while suppressing decrease of the channel mobility.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
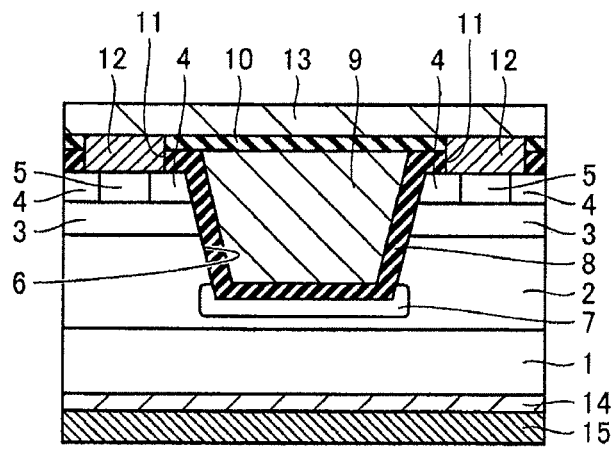
FIG. 1 is a cross sectional view schematically showing a semiconductor device in one embodiment of the present invention.

The following describes an embodiment of the present invention with reference to figures. It should be noted that in the below-mentioned figures, the same or corresponding portions are given the same reference characters and are not described repeatedly.

Referring to FIG. 1, a silicon carbide semiconductor device of the present embodiment is a vertical type insulated gate field effect transistor (MOSFET) including a trench having inclined side walls 6. The semiconductor device shown in FIG. 1 has a substrate 1 made of silicon carbide and having n type conductivity, and a silicon carbide layer epitaxially formed on a main surface of substrate 1. The silicon carbide layer includes: a breakdown voltage holding layer 2 having n type conductivity; p type body layers 3 (body regions) each having p type conductivity; n type source contact layers 4 each having n type conductivity; and contact regions 5 each having p type conductivity. Further, the semiconductor device includes a gate insulating film 8, a gate electrode 9, an interlayer insulating film 10, source electrodes 12, a source wire electrode 13, a drain electrode 14, and a backside surface protecting electrode 15.

Substrate 1 is made of silicon carbide of hexagonal crystal type. Breakdown voltage holding layer 2 is formed on one main surface of substrate 1. Each of p type body layers 3 is formed on breakdown voltage holding layer 2. Thus, breakdown voltage holding layer 2 separates p type body layer 3 and substrate 1 from each other.

P type body layer 3 has an impurity density of not less than $5 \times 10^{16}$ cm$^{-3}$ and preferably not more than $1 \times 10^{20}$ cm$^{-3}$, more preferably, not less than $8 \times 10^{16}$ cm$^{-3}$ and not more than $3 \times 10^{18}$ cm$^{-3}$.

On p type body layer 3, n type source contact layer 4 is formed. P type contact region 5 is formed to be surrounded by n type source contact layer 4.

By removing portions of n type source contact layer 4, p type body layer 3, and breakdown voltage holding layer 2, a trench is formed. The trench has side walls 6 each serving as a surface inclined relative to the main surface of substrate 1. Each of side walls 6 has an off angle of not less than 50° and not more than 65° relative to a {0001} plane. The inclined surface surrounds a projection portion (projection-shaped portion having an upper surface on which source electrode 12 is formed). The projection portion may have a hexagonal planar shape, for example.

Preferably, side wall 6 has an off orientation forming an angle of 5° or smaller relative to a <01-10> direction. In this way, side wall 6 has a plane orientation close to a {03-38} plane. Further, side wall 6 has an off angle of not less than −3° and not more than 5° relative to the {03-38} plane in the <01-10> direction. Further, side wall 6 corresponds to a plane of the carbon plane side of (000-1) in silicon carbide constituting substrate 1. In other words, assuming that the plane orientation of side wall 6 is a (hklm) plane, m has a negative value.

For example, the plane orientation of the main surface of substrate 1 corresponds to substantially the (000-1) plane. The plane orientation of side wall 6 substantially includes the (03-3-8) plane, the (−303-8) plane, the (3-30-8) plane, the (0-33-8) plane, the (30-3-8) plane, and the (−330-8) plane. These six planes are disposed to surround the bottom portion of the trench when viewed in a planar view. The bottom portion of the trench may have a hexagonal shape when viewed in a planar view. In this case, the above-described six planes are respectively connected to the six sides of the hexagon. Alternatively, the bottom portion of the trench may have a substantially point-like shape. In this case, the trench is substantially formed of only side walls 6.

Gate insulating film 8 is formed on side walls 6 and the bottom portion of the trench. Gate insulating film 8 extends onto the upper surface of each of n type source contact layers 4. Preferably, gate insulating film 8 has a thickness of not less than 25 nm and not more than 70 nm. Preferably, a barrier height is not less than 2.2 eV and not more than 2.6 eV at an interface between p type body layer 3 and gate insulating film 8 on side wall 6.

On gate insulating film 8, gate electrode 9 is formed to fill the inside of the trench. Gate electrode 9 has an upper surface substantially as high as the upper surface of a portion of gate insulating film 8 on the upper surface of each of n type source contact layers 4. Preferably, the gate electrode is made of p type polysilicon.

According to the above-described configuration, each p type body layer 3 (body region having a first conductivity type) faces gate electrode 9 with gate insulating film 8 interposed therebetween. Further, breakdown voltage holding layer 2, p type body layers 3, and n type source contact layers 4 are stacked on one another in this order along side wall 6. As a result, p type body layer 3 separates breakdown voltage holding layer 2 and each n type source contact layer 4 (a pair of regions having a second conductivity type) from each other.

Interlayer insulating film 10 is formed to cover gate electrode 9 as well as the portion of gate insulating film 8 on the upper surface of each of n type source contact layers 4. By removing portions of interlayer insulating film 10 and gate insulating film 8, openings 11 are formed to expose portions of n type source contact layers 4 and p type contact regions 5. Source electrodes 12 are formed in contact with p type contact regions 5 and the portions of n type source contact layers 4 so as to fill the inside of openings 11. Source wire electrode 13 is formed in contact with the upper surfaces of source electrodes 12 and extends on the upper surface of interlayer insulating film 10. Further, drain electrode 14 is formed on the backside surface of substrate 1 opposite to its main surface on which breakdown voltage holding layer 2 is formed. This drain electrode 14 is an ohmic electrode. Drain electrode 14 has a surface which is opposite to its surface facing substrate 1 and on which a backside surface protecting electrode 15 is formed.

In the semiconductor device shown in FIG. 1, each of side walls 6 of the trench is inclined and substantially corresponds to the {03-3-8} plane. As seen from FIG. 1, each of side walls 6 thus corresponding to the so-called "semi-polar plane" can be used as a channel region, which is an active region of the semiconductor device. Because each of these side walls 6 thus corresponds to the stable crystal plane, leakage current can be reduced sufficiently and higher breakdown voltage can be obtained in the case where side wall 6 is employed for the channel region, as compared with a case where another crystal plane (such as the (0001) plane) is employed for the channel region.

The following describes an operation of the semiconductor device shown in FIG. 1. Referring to FIG. 1, when a voltage equal to or smaller than the threshold voltage is applied to gate electrode 9, i.e., when the semiconductor device is in an OFF state, p type body layer 3 and breakdown voltage holding layer 2 of n type conductivity are reverse-biased. Hence, it is in a non-conductive state. On the other hand, when gate electrode 9 is fed with a positive voltage, an inversion layer is formed in the channel region near a region of p type body layer 3 in contact with gate insulating film 8. Accordingly, n type source contact layer 4 and breakdown voltage holding layer 2 are electrically connected to each other. As a result, a current flows between source electrode 12 and drain electrode 14. Accordingly, the semiconductor device is brought into ON state.

According to the present embodiment, each of side walls 6 has an off angle of not less than 50° and not more than 65° relative to the {0001} plane. Accordingly, mobility (channel mobility) of carriers (electrons) can be suppressed from being decreased in the channel region, even when the threshold voltage is positively shifted in value by forming p type body layers 3 doped with a p type impurity at a high density of $5\times10^{16}$ cm$^{-3}$ or greater. Accordingly, the semiconductor device becomes a MOSFET of substantially normally-off type or of normally-off type with the threshold voltage being positively shifted in value while suppressing decrease of the channel mobility. In order to further positively shift the threshold voltage in value, the p type impurity density of each p type body layer 3 may be set at $1\times10^{17}$ cm$^{-3}$ or greater, or can be set at $5\times10^{17}$ cm$^{-3}$ or greater.

Preferably, with the impurity concentration of p type body layer 3 being sufficiently high, the semiconductor device is the normally-off type. Further, in the ON state, a channel resistance, which is a resistance value in the channel region formed in p type body layer 3, is smaller than a drift resistance, which is a resistance value in breakdown voltage holding layer 2.

Preferably, the threshold voltage of gate electrode 9, by which a weak inversion layer is formed in p type body layer 3, is 2V or greater in a temperature range of not less than a room temperature and not more than 100° C. More preferably, the threshold voltage is 3V or greater at 100° C. Further, the threshold voltage is 1V or greater at 200° C.

Preferably, the threshold voltage has a temperature dependency of –10 mV/° C. or greater. The value (mV/° C.) of the temperature dependency of the threshold voltage is substantially constant under a temperature region in which the semiconductor device is normally used. In the case where the value needs to be define in a strict manner, the value can be defined as, for example, inclination of a straight line obtained by linearly approximating the temperature dependency of the threshold voltage from 25° C. to 200° C.

If the plane orientation of side wall 6 corresponds to the (0001) plane unlike in the present embodiment and the impurity density of p type body layer 3 is high, i.e., $5\times10^{16}$ cm$^{-3}$ or greater, the temperature dependency of the threshold voltage hardly becomes –10 mV/° C. or greater. This is due to the following reason. That is, in the (0001) plane, as the impurity density is increased, trap levels are likely to be large. When the trap levels are large, a larger amount of trapped electrons will be released as temperature is increased. As a result, drain current is greatly increased as the temperature is increased. In this case, the threshold voltage is decreased greatly as the temperature is increased. In other words, the value of the temperature dependency of the threshold voltage becomes a negative value whose absolute value is large.

Preferably, the channel mobility of electrons are 30 cm$^2$/Vs or greater at a room temperature. More preferably, the channel mobility of electrons is 50 cm$^2$/Vs or greater at 100° C. Further, the channel mobility of electrons are 40 cm$^2$/Vs or greater at 150° C. Further, the temperature dependency of the channel mobility of electrons is –0.3 cm$^2$/Vs° C. or greater.

The following describes a method for manufacturing the semiconductor device shown in FIG. 1 in the present invention, with reference to FIG. 2 to FIG. 9.

Figure 2:
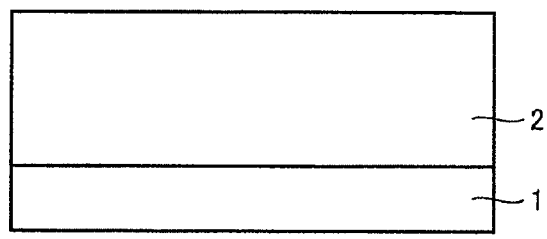
FIG. 2 is a schematic cross sectional view for illustrating a method for manufacturing the semiconductor device shown in FIG. 1.

First, referring to FIG. 2, on the main surface of substrate 1 made of silicon carbide, a silicon carbide layer having n type conductivity is epitaxially formed. The silicon carbide layer has a portion that is located at the substrate 1 side and that will serve as breakdown voltage holding layer 2 without any modification. The silicon carbide layer is epitaxially grown by means of a CVD method that utilizes a mixed gas of silane (SiH$_4$) and propane (C$_3$H$_8$) as a material gas and utilizes hydrogen gas (H$_2$) as a carrier gas, for example. In doing so, it is preferable to introduce nitrogen (N) or phosphorus (P) as an impurity of n type conductivity, for example. This breakdown voltage holding layer 2 can contain the n type impurity at a concentration of, for example, not less than $5\times10^{15}$ cm$^{-3}$ and not more than $5\times10^{16}$ cm$^{-3}$.

Next, ions are implanted into the upper surface layer of breakdown voltage holding layer 2, thereby forming p type body layer 3 and n type source contact layer 4. In the ion implantation for forming p type body layer 3, ions of an impurity of p type conductivity such as aluminum (Al) are implanted. In doing so, by adjusting acceleration energy of the ions to be implanted, the depth of the region in which p type body layer 3 is to be formed can be adjusted.

Figure 3:
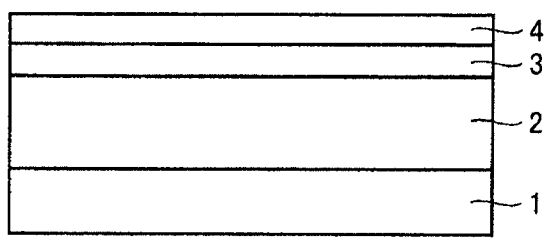
FIG. 3 is a schematic cross sectional view for illustrating the method for manufacturing the semiconductor device shown in FIG. 1.

Next, ions of an impurity of n type conductivity are implanted into breakdown voltage holding layer 2 thus having p type body layer 3 formed therein, thereby forming n type source contact layer 4. An exemplary, usable n type impurity is phosphorus or the like. In this way, a structure shown in FIG. 3 is obtained.

Figure 4:
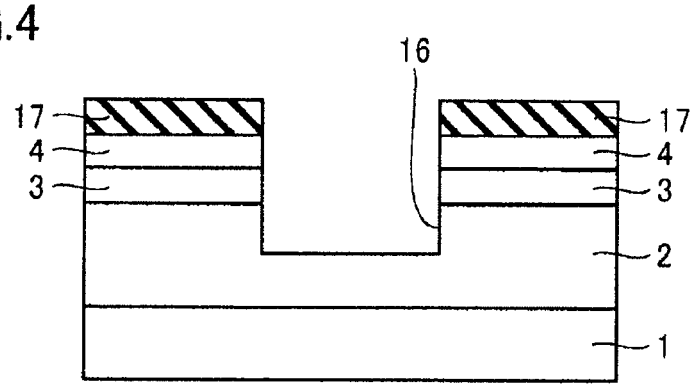
FIG. 4 is a schematic cross sectional view for illustrating the method for manufacturing the semiconductor device shown in FIG. 1.

Next, as shown in FIG. 4, a mask layer 17 is formed on the upper surface of n type source contact layer 4. As mask layer 17, an insulating film such as a silicon oxide film can be used. As a method for forming mask layer 17, the following process can be employed, for example. That is, a silicon oxide film is formed on the upper surface of n type source contact layer 4 by means of the CVD method or the like. Then, a resist film (not shown) having a predetermined opening pattern is formed on the silicon oxide film by means of the photolithography method. Using the resist film as a mask, a portion of the silicon oxide film is removed by etching. Thereafter, the resist film is removed. As a result, mask layer 17 is formed which has an opening pattern in conformity with a region where the trench shown in FIG. 4 is to be formed.

Then, using mask layer 17 as a mask, portions of n type source contact layer 4, p type body layer 3, and breakdown voltage holding layer 2 are removed by means of etching. An exemplary, usable etching method is reactive ion etching (RIE), in particular, inductively coupled plasma (ICP) RIE. Specifically, for example, ICP-RIE can be used which employs, as reaction gas, $SF_6$ or a mixed gas of $SF_6$ and $O_2$. As a result of such etching, a trench having vertical walls 16 substantially perpendicular to the main surface of substrate 1 can be formed in a region in which the trench having side walls 6 (FIG. 1) inclined relative to the main surface of substrate 1 is to be formed. In this way, a structure shown in FIG. 4 is obtained.

Figure 5:
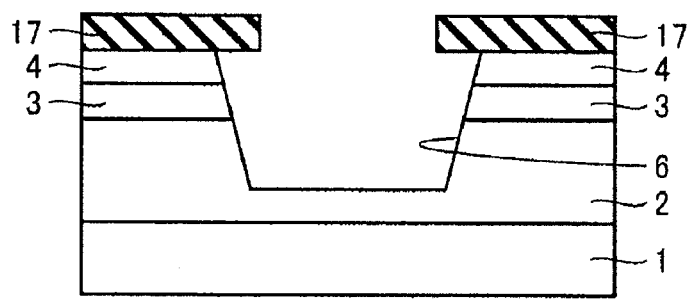
FIG. 5 is a schematic cross sectional view for illustrating the method for manufacturing the semiconductor device shown in FIG. 1.

Next, a thermal etching step is performed to exhibit a predetermined crystal plane in each of breakdown voltage holding layer 2, p type body layer 3, and n type source contact layer 4. Specifically, each of vertical walls 16 shown in FIG. 4 is etched (thermally etched) at a heat treatment temperature of not less than 700° C. and not more than 1000° C. using a mixed gas of oxygen gas and chlorine gas as the reaction gas, thereby forming the trench having side walls 6 inclined relative to the main surface of substrate 1 as shown in FIG. 5, for example.

Here, the thermal etching step can be performed under conditions that, for example, a flow rate ratio of the chlorine gas to the oxygen gas ((chlorine gas flow rate)/(gaseous oxygen flow rate)) is not less than 0.5 and not more than 4.0, more preferably, not less than 1.0 and not more than 2.0. It should be noted that the reaction gas may contain a carrier gas in addition to the chlorine gas and the oxygen gas. As the carrier gas, there can be used nitrogen ($N_2$) gas, argon gas, helium gas, or the like, for example. When the heat treatment temperature is set at not less than 700° C. and not more than 1000° C., a rate of etching SiC is approximately, for example, 70 mm/hr. Further, when using silicon oxide ($SiO_2$) as mask layer 17 in this case, a selection ratio of SiC to $SiO_2$ can be very large. Accordingly, mask layer 17 made of $SiO_2$ is not substantially etched during etching of SiC.

It should be noted that the crystal plane exhibited at each of side walls 6 is, for example, the {03-3-8} plane. Namely, in the etching under the above-described conditions, side wall 6 of the trench is spontaneously formed to correspond to the {03-3-8} plane, which is a crystal plane allowing for the slowest etching rate. As a result, a structure shown in FIG. 5 is obtained.

Figure 6:
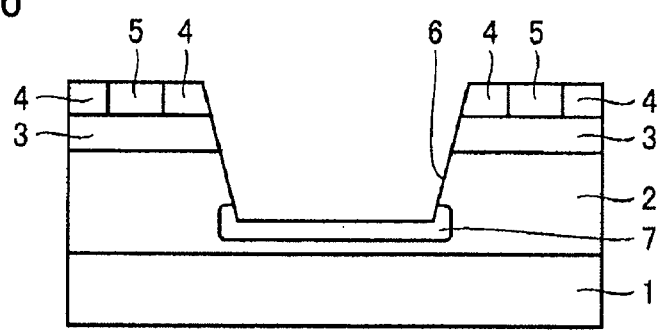
FIG. 6 is a schematic cross sectional view for illustrating the method for manufacturing the semiconductor device shown in FIG. 1.

Next, mask layer 17 is removed by means of an appropriate method such as etching. Thereafter, a resist film (not shown) having a predetermined pattern is formed using a photolithography method so as to extend from the inside of the trench having side walls 6 onto each of the upper surfaces of n type source contact layers 4. As the resist film, there can be used a resist film having an opening pattern in conformity with the bottom portion of the trench and a portion of the upper surface of n type source contact layer 4. By implanting ions of an impurity of p type conductivity using this resist film as a mask, an electric field relaxing region 7 is formed at the bottom portion of the trench and contact region 5 of p type conductivity is formed at the region of the portion of n type source contact layer 4. Thereafter, the resist film is removed. As a result, a structure shown in FIG. 6 is obtained.

Then, an activation annealing step is performed to activate the impurity implanted by means of the above-described ion implantation. In this activation annealing step, the annealing treatment is performed without forming any particular cap layer on the surface of the silicon carbide layer. Here, the inventors have found that even when the activation annealing treatment is performed without forming a protective film such as the cap layer on the surface thereof in the case where the above-described {03-3-8} plane is employed, a property of the surface is never deteriorated and sufficient surface smoothness can be maintained. Thus, the conventionally required step of forming the protective film (cap layer) before the activation annealing treatment is omitted and the activation annealing step is directly performed. It should be noted that the above-described cap layer may be formed before performing the activation annealing step. Alternatively, for example, the cap layer may be provided only on the upper surfaces of n type source contact layer 4 and p type contact region 5 before performing the activation annealing treatment.

Figure 7:
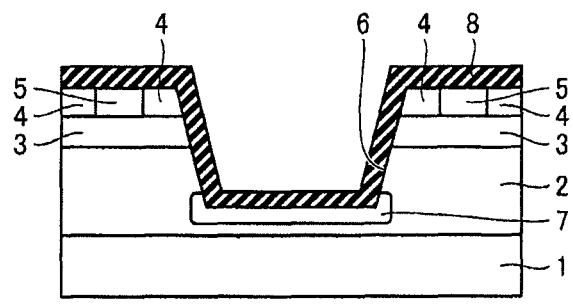
FIG. 7 is a schematic cross sectional view for illustrating the method for manufacturing the semiconductor device shown in FIG. 1.

Next, as shown in FIG. 7, gate insulating film 8 is formed to extend from the inside of the trench having side walls 6 onto the upper surfaces of n type source contact layers 4 and p type contact regions 5. As gate insulating film 8, for example, there can be used an oxide film (silicon oxide film) obtained by thermally oxidizing the silicon carbide layer. In this way, a structure shown in FIG. 7 is obtained.

Figure 8:
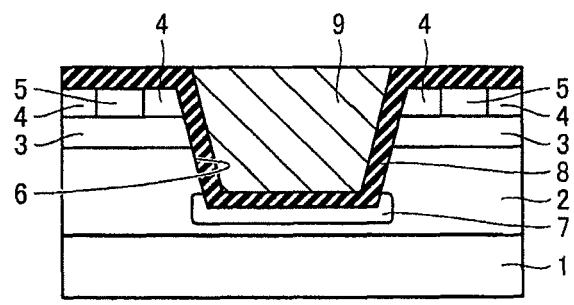
FIG. 8 is a schematic cross sectional view for illustrating the method for manufacturing the semiconductor device shown in FIG. 1.

Next, as shown in FIG. 8, gate electrode 9 is formed on gate insulating film 8 so as to fill the inside of the trench having side walls 6. As a method for forming gate electrode 9, the following method can be used, for example. First, a sputtering method or the like is employed to form a conductor film on gate insulating film 8. The conductor film is to be the gate electrode extending to the inside of the trench and to a region on p type contact region 5. The conductor film may be made of any material such as a metal as long as the material has conductivity. Thereafter, an appropriate method such as an etch back method or a CMP method is used to remove a portion of the conductor film formed on regions other than the inside of the trench. As a result, the conductor film filling the inside of the trench remains to constitute gate electrode 9. In this way, a structure shown in FIG. 8 is obtained.

Next, interlayer insulating film 10 (see FIG. 9) is formed to cover the upper surface of gate electrode 9 and the upper surface of gate insulating film 8 exposed on p type contact region 5. The interlayer insulating film can be made of any material as long as the material is insulative. Further, a resist film having a pattern is formed on interlayer insulating film 10, using the photolithography method. The resist film (not shown) is provided with an opening pattern formed in conformity with a region on p type contact region 5.

Using this resist film as a mask, portions of interlayer insulating film 10 and gate insulating film 8 are removed by means of etching. As a result, openings 11 (see FIG. 9) are formed to extend through interlayer insulating film 10 and gate insulating film 8. Each of openings 11 has a bottom portion at which p type contact region 5 and a portion of n type source contact layer 4 are exposed. Thereafter, a conductor film to serve as source electrode 12 (see FIG. 9) is formed to fill the inside of opening 11 and cover the upper surface of the above-described resist film. Thereafter, the resist film is removed using a chemical solution or the like, thereby simultaneously removing (lifting off) the portion of the conductor film formed on the resist film. As a result, the conductor film filling the inside of opening 11 constitutes source electrode 12. This source electrode 12 is an ohmic electrode making ohmic contact with p type contact region 5 and n type source contact layer 4.

Figure 9:
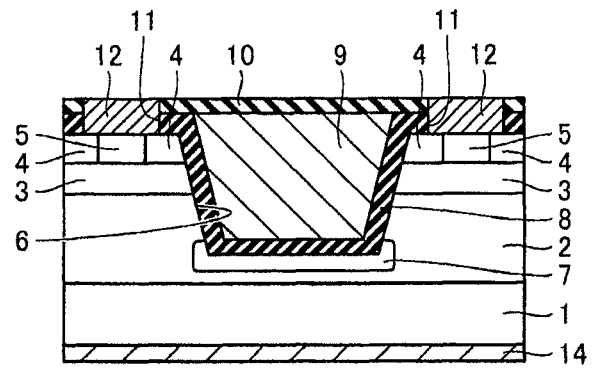
FIG. 9 is a schematic cross sectional view for illustrating the method for manufacturing the semiconductor device shown in FIG. 1.

Further, drain electrode 14 (see FIG. 9) is formed on the backside surface of substrate 1 (the surface thereof opposite to the main surface thereof on which breakdown voltage holding layer 2 is formed). Drain electrode 14 can be made of any material as long as the material allows for ohmic contact with substrate 1. In this way, a structure shown in FIG. 9 is obtained.

Thereafter, an appropriate method such as the sputtering method is employed to form source wire electrode 13 (see FIG. 1) and backside surface protecting electrode 15 (see FIG. 1). Source wire electrode 13 makes contact with the upper surface of source electrode 12, and extends on the upper surface of interlayer insulating film 10. Backside surface protecting electrode 15 is formed on the surface of drain electrode 14. As a result, the semiconductor device shown in FIG. 1 can be obtained.

It has been illustrated that the first and second conductivity types of the present invention respectively correspond to p type and n type, but the first and second conductivity types may respectively correspond to n type and p type. In this case, gate electrode 9 is preferably made of n type polysilicon.

The present invention is particularly advantageously applied to a silicon carbide semiconductor device having a gate electrode.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A silicon carbide semiconductor device comprising:
a substrate made of silicon carbide having a hexagonal crystal structure and having a main surface;
a silicon carbide layer epitaxially formed on said main surface of said substrate, said silicon carbide layer being provided with a trench having a side wall inclined relative to said main surface, said side wall having an off angle of not less than 50° and not more than 65° relative to a {0001} plane;
a gate insulating film provided on said side wall of said silicon carbide layer; and
a gate electrode provided on said gate insulating film, said silicon carbide layer including a body region having a first conductivity type and facing said gate electrode with said gate insulating film being interposed therebetween, a channel region formed at a surface of said body region along said side wall, and a pair of regions separated from each other by said body region and having a second conductivity type, said body region having an impurity density of $5 \times 10^{16}$ cm$^{-3}$ or greater such that said gate electrode has a threshold voltage which allows a weak inversion layer to be formed in said body region, said threshold voltage being 2 V or greater in a temperature range of not less than a room temperature and not more than 100° C. and such that channel mobility of electrons is 30 cm$^2$/Vs or greater at the room temperature.

2. The silicon carbide semiconductor device according to claim 1, wherein said side wall has an off orientation forming an angle of 5° or smaller relative to a <01-10> direction.

3. The silicon carbide semiconductor device according to claim 2, wherein said side wall has an off angle of not less than −3° and not more than 5° relative to a {03-38} plane relative to the <01-10> direction.

4. The silicon carbide semiconductor device according to claim 1, wherein said side wall corresponds to a plane of a carbon plane side of the silicon carbide constituting said substrate.

5. The silicon carbide semiconductor device according to claim 1, wherein said body region has an impurity density of $1 \times 10^{20}$ cm$^{-3}$ or smaller.

6. The silicon carbide semiconductor device according to claim 1, wherein the silicon carbide semiconductor device is a normally-off type.

7. The silicon carbide semiconductor device according to claim 6, wherein said gate electrode is made of polysilicon having said first conductivity type.

8. The silicon carbide semiconductor device according to claim 1, wherein said gate electrode is made of n type polysilicon.

9. The silicon carbide semiconductor device according to claim 1, wherein said gate insulating film has a thickness of not less than 25 nm and not more than 70 nm.

10. The silicon carbide semiconductor device according to claim 1, wherein said first conductivity type is p type and said second conductivity type is n type.

11. The silicon carbide semiconductor device according to claim 10, wherein said body region has an impurity density of not less than $8 \times 10^{16}$ cm$^{-3}$ and not more than $3 \times 10^{18}$ cm$^{-3}$.

12. The silicon carbide semiconductor device according to claim 1, wherein said threshold voltage is 3 V or greater at 100° C.

13. The silicon carbide semiconductor device according to claim 1, wherein said threshold voltage is 1 V or greater at 200° C.

14. The silicon carbide semiconductor device according to claim 1, wherein said threshold voltage has a temperature dependency of −10 mV/° C. or greater.

15. The silicon carbide semiconductor device according to claim 1, wherein the channel mobility of electrons is 50 cm$^2$/Vs or greater at 100° C.

16. The silicon carbide semiconductor device according to claim 1, wherein the channel mobility of electrons is 40 cm$^2$/Vs or greater at 150° C.

17. The silicon carbide semiconductor device according to claim 1, wherein the channel mobility of electrons has a temperature dependency of −0.3 cm$^2$/Vs° C. or greater.

18. The silicon carbide semiconductor device according to 1, wherein a barrier height at an interface between said silicon carbide layer and said gate insulating film is not less than 2.2 eV and not more than 2.6 eV.

19. The silicon carbide semiconductor device according to 1, wherein:

said pair of regions include a breakdown voltage holding layer (2) separating said body region and said substrate from each other, and in an ON state, a channel resistance, which is a resistance value of a channel region formed in said body region, is smaller than a drift resistance, which is a resistance value in said breakdown voltage holding layer.

20. The silicon carbide semiconductor device according to 1, wherein the silicon carbide semiconductor device is a vertical type insulated gate field effect transistor.

21. The silicon carbide semiconductor device according to 1, wherein said side wall is formed through thermal etching.

22. The silicon carbide semiconductor device according to 1, further comprising two or more sets of said side walls facing each other, wherein each of said two or more sets of side walls facing each other has an off angle of not less than 50° and not more than 65° relative to the {0001} plane.

23. A silicon carbide semiconductor device comprising:

a substrate made of silicon carbide having a hexagonal crystal structure and having a main surface;

a silicon carbide layer epitaxially formed on said main surface of said substrate, said silicon carbide layer being provided with a trench having first to sixth side walls inclined relative to said main surface, said first to sixth side walls being formed of a (03-3-8) plane, a (−303-8) plane, a (3-30-8) plane, a (0-33-8) plane, a (30-3-8) plane, and a (−330-8) plane, each of which has an off angle of not less than −3° and not more than 5° relative to a <01-10> direction;

a gate insulating film provided on said first to sixth side walls of said silicon carbide layer; and a gate electrode provided on said gate insulating film, said silicon carbide layer including a body region having a first conductivity type and facing said gate electrode with said gate insulating film being interposed therebetween, a channel region formed at a surface of said body region along said first to sixth side walls, and a pair of regions separated from each other by said body region and having a second conductivity type, said body region having an impurity density of $5 \times 10^{16}$ cm$^{-3}$ or greater.

24. A silicon carbide semiconductor device comprising:

a substrate made of silicon carbide having a hexagonal crystal structure and having a main surface;

a silicon carbide layer epitaxially formed on said main surface of said substrate, said silicon carbide layer being provided with a trench having first and second side walls adjacent to each other and inclined relative to said main surface, each of said first and second side walls having an off angle of not less than 50° and not more than 65° relative to a {0001} plane;

a gate insulating film provided on said first and second side walls of said silicon carbide layer; and a gate electrode provided on said gate insulating film, said silicon carbide layer including a body region having a first conductivity type and facing said gate electrode with said gate insulating film being interposed therebetween, a channel region formed at a surface of said body region along said first and second side walls, and a pair of regions separated from each other by said body region and having a second conductivity type, said body region having an impurity density of $5 \times 10^{16}$ cm$^{-3}$ or greater.

* * * * *

UNITED STATES PATENT AND TRADEMARK OFFICE
CERTIFICATE OF CORRECTION

PATENT NO. : 8,686,435 B2  
APPLICATION NO. : 13/434233  
DATED : April 1, 2014  
INVENTOR(S) : Masuda et al.

Page 1 of 1

It is certified that error appears in the above-identified patent and that said Letters Patent is hereby corrected as shown below:

In the claims:

In claim 11, at column 12, in line 42, "$8 \times 10^{16} \, cm^{-3}$ and not more than $3 \times 10^{18} \, cm^{-3}$" should be --$8 \times 10^{16} \, cm^{-3}$ and not more than $3 \times 10^{18} \, cm^{-3}$--.

In claim 23, at column 14, in line 9, "$5 \times 10^{16} \, cm^{-3}$ or greater" should be --$5 \times 10^{16} \, cm^{-3}$ or greater--.

Signed and Sealed this  
Nineteenth Day of August, 2014

Michelle K. Lee  
*Deputy Director of the United States Patent and Trademark Office*